(12) United States Patent
Farooq et al.

(10) Patent No.: US 7,919,356 B2
(45) Date of Patent: Apr. 5, 2011

(54) METHOD AND STRUCTURE TO REDUCE CRACKING IN FLIP CHIP UNDERFILL

(75) Inventors: Mukta G. Farooq, Hopewell Junction, NY (US); Robert Hannon, Wappingers Falls, NY (US); Dae-Young Jung, Vestal, NY (US); Ian D. Melville, Highland, NY (US)

(73) Assignee: International Business Machines Corporation, Armonk, NY (US)

( * ) Notice: Subject to any disclaimer, the term of this patent is extended or adjusted under 35 U.S.C. 154(b) by 753 days.

(21) Appl. No.: 11/831,026

(22) Filed: Jul. 31, 2007

(65) Prior Publication Data

US 2009/0032974 A1   Feb. 5, 2009

(51) Int. Cl.
  *H01L 21/44* (2006.01)
(52) U.S. Cl. ......... 438/108; 438/112; 438/118; 438/127
(58) Field of Classification Search .................. 438/108, 438/112, 118, 119, 124, 126, 127
See application file for complete search history.

(56) References Cited

U.S. PATENT DOCUMENTS

| | | |
|---|---|---|
| 6,372,511 B1 | 4/2002 | Silver et al. |
| 6,794,225 B2 * | 9/2004 | Manepalli et al. ............. 438/127 |
| 6,984,286 B2 | 1/2006 | Bonitz et al. |
| 2007/0099346 A1 * | 5/2007 | Farooq et al. ................. 438/108 |

* cited by examiner

*Primary Examiner* — Kevin M Picardat
(74) *Attorney, Agent, or Firm* — Cantor Colburn LLP; Katherine Brown

(57) ABSTRACT

A method of assembling a microelectronic flip-chip arrangement includes attaching a chip having a defined length to a supporting substrate, wherein the chip forms a chip shadow line of the defined length on the supporting substrate, creating a first non-wettable zone on an outer portion of the bottom surface of the chip, creating a second non-wettable zone on a portion of the supporting substrate outside the chip shadow line, underfilling the chip and forming a fillet, wherein the fillet does not extend beyond the chip shadow line, and hardening the underfill including the fillet.

12 Claims, 5 Drawing Sheets

METHOD AND STRUCTURE TO REDUCE CRACKING IN FLIP CHIP UNDERFILL

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to an electronic structure, and associated method of fabrication, for reducing corner cracking in flip chip underfill.

2. Description of Background

It is known to form a microelectronic assembly by a direct chip attach method, commonly referred to as flip chip. An example of such microelectronic assembly is the assembly shown in prior art FIGS. 1A and 1B, wherein an integrated circuit die 10 is mounted directly onto a supporting substrate 22. The supporting substrate 22 may be a printed circuit board or a package board with solder bump interconnections 12. The integrated circuit die 10 is spaced apart from the supporting substrate by a gap (not shown), and the solder bump interconnections 12 extend across the gap and connect bond pads 18 on the integrated circuit die 10 to bond pads 20 on the supporting substrate 22. In this manner, the integrated circuit die 10 is attached to the supporting substrate, and electrical signals are conducted to and from the die 10 for processing.

Because of differences in the coefficients of thermal expansion of the die 10 and the supporting substrate 22, stresses are created when the assembly is subjected to thermal cycling of the type experienced during operation. These stresses tend to fatigue the solder bump interconnections 12 and can lead to failure of the assembly. Failure of the assembly manifests itself in the form of cracks, interconnection failure, and the like. In order to strengthen the solder joints without affecting the electrical connection, the gap is filled with a polymeric underfill material 14.

The underfill material 14 is typically applied after the die 10 is attached by the solder bump interconnections 12 to the supporting substrate 22. A curable polymeric underfill material is dispensed onto the supporting substrate 22 adjacent to the die 10 and is drawn into the gap by capillary action. An additional amount of the underfill material is applied along the edges of the die 10 so as to form a uniform fillet 16 that extends beyond the edge of the die 10, and at least partially up the side of the die 10. The polymeric material is then cured, typically by heating, to form the underfill. The underfill bonds to the die 10, the supporting substrate, and the solder bumps, thereby strengthening the assembly and protecting the solder bump interconnections from environmental damage.

The curing process, however, creates thermal stresses during the heating and cooling of the assembly. Mechanical stresses are also experienced during use of the microelectronic assembly, particularly in portable applications such as cell phones, PDA's, and the like. These stresses are normally detrimental to the die and the solder bump interconnections and can cause a detrimental warping of the integrated circuit die. The stresses also lead to cracking of the underfill. As shown in exemplary prior art FIG. 2, a fillet 16 is disposed outside the outer perimeter of the die, i.e., outside the die shadow. The cracking 30 of the underfill commences from the fillet 16 and a corner 32 of the die and propagates, with a force concentrated at the tip of the crack, through the solder bumps which are bonded with the underfill.

Therefore, a need exists to reduce the detrimental effects of thermally induced stresses upon an underfill and the solder bump interconnections of a microelectronic assembly. Further, a need exists to strengthen and improve the reliability of a microelectronic assembly that includes reducing cracks in the underfill to improve the reliability of electrical interconnections and to extend the useful life of an underfilled flip-chip arrangement.

SUMMARY OF THE INVENTION

The shortcomings of the prior art are overcome and additional advantages are provided through the provision of a method of assembling a microelectronic flip-chip arrangement, the method includes attaching a chip having a defined length to a supporting substrate, wherein the chip forms a chip shadow line of the defined length on the supporting substrate, creating a first non-wettable zone on an outer portion of the bottom surface of the chip, creating a second non-wettable zone on a portion of the supporting substrate outside the chip shadow line, underfilling the chip and forming a fillet, wherein the fillet does not extend beyond the chip shadow line, and hardening the underfill including the fillet.

A method to reduce fillet cracking in cured flip-chip underfill includes removing at least a portion of the original fillet located beyond a chip shadow line by the chip, and creating a new fillet beginning at the bottom surface of the chip and extending down to a supporting substrate without extending beyond the chip shadow line.

A method of assembling a microelectronic flip-chip arrangement includes attaching a chip having a defined length to a supporting substrate, wherein the chip forms a chip shadow line of the defined length on the supporting substrate, underfilling the chip and forming a fillet on the periphery of the chip extending down the supporting substrate beyond the chip shadow line, hardening the underfill including the fillet, and removing at least a portion of the fillet such that the fillet begins at the bottom surface of the chip and extends down to the supporting substrate without extending beyond the chip shadow line.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

Disclosed herein are methods to reduce cracking in flip chip underfill and microelectronic assembly structures thereof. The methods are used to create flip-chip microelectronic assemblies wherein the fillet of the underfill material does not extend beyond the shadow line of the chip itself. As used herein, the term "shadow line" is intended to mean the imaginary line or boundary created by the defined length dimensions of the chip on the supporting substrate. In other words, the footprint area the chip would inhabit on the supporting substrate if it were directly mounted to the substrate, rather than separated by a gap defined by the size of the controlled collapse chip connections (C4 connections). The fillet location/formation as disclosed reduces underfill cracking by shortening the run path before the crack meets the C4 connections, e.g., the solder bump interconnections. Moreover, by removing the traditional fillet that extends beyond the chip shadow line, particularly the corner fillet portions, the most common crack initiation points are eliminated from the flip-chip microelectronic assembly.

In one embodiment, the microelectronic assembly is formed by conventional flip-chip attachment methods, but with the added step of creating non-wettable zones on both the chip and supporting substrate that prevent the underfill from adhering the chip and substrate in those zones and forms a boundary by which the fillet forms within the chip shadow line.

As a result of the summarized invention, technically we have achieved a method of assembling a flip-chip microelectronic structure, which can reduce cracking in the underfill and, therefore, improve the thermal cycling life of the assembly.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The present inventive method and structure addresses problems related to corner cracking and ensuing damage due to thermal cyclic stressing of a microelectronic assembly. The cracking of a fillet, followed by that of the underfill material and solder bumps, is reduced by the present invention, in part, by changing the location of the fillet with regard to the chip.

Figure 1A:
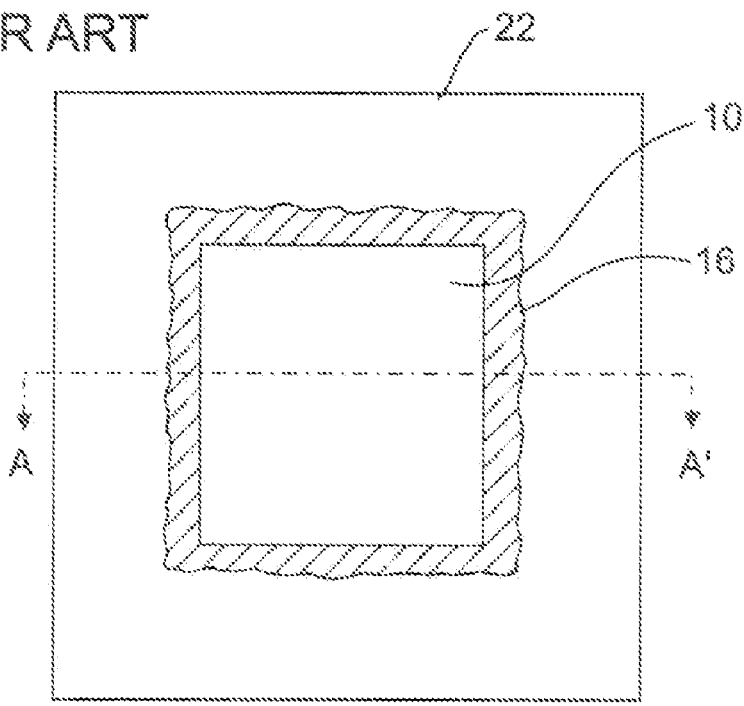
FIG. 1 illustrates a prior art microelectronic assembly from (A) a top-down perspective view, and (B) a cross-sectional perspective view.
Figure 1B:
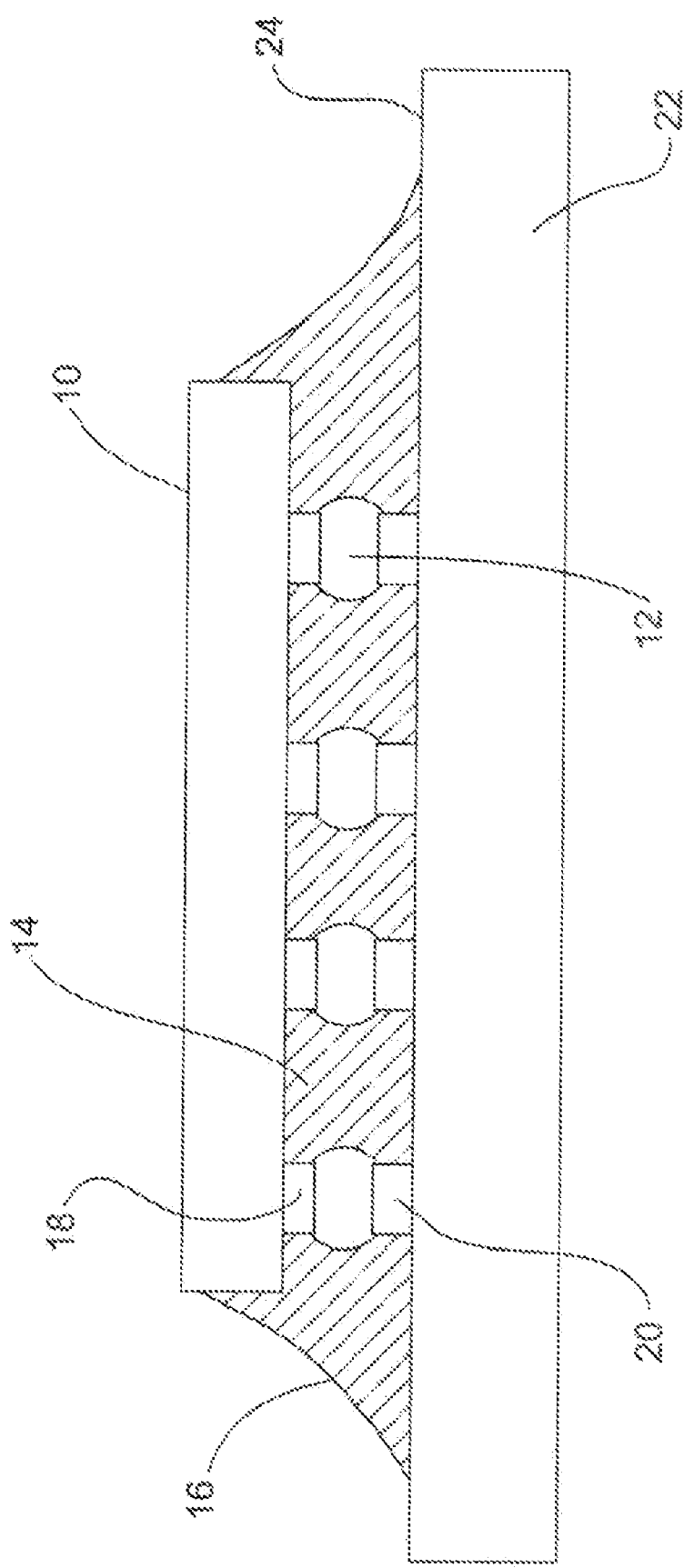
Figure 2:
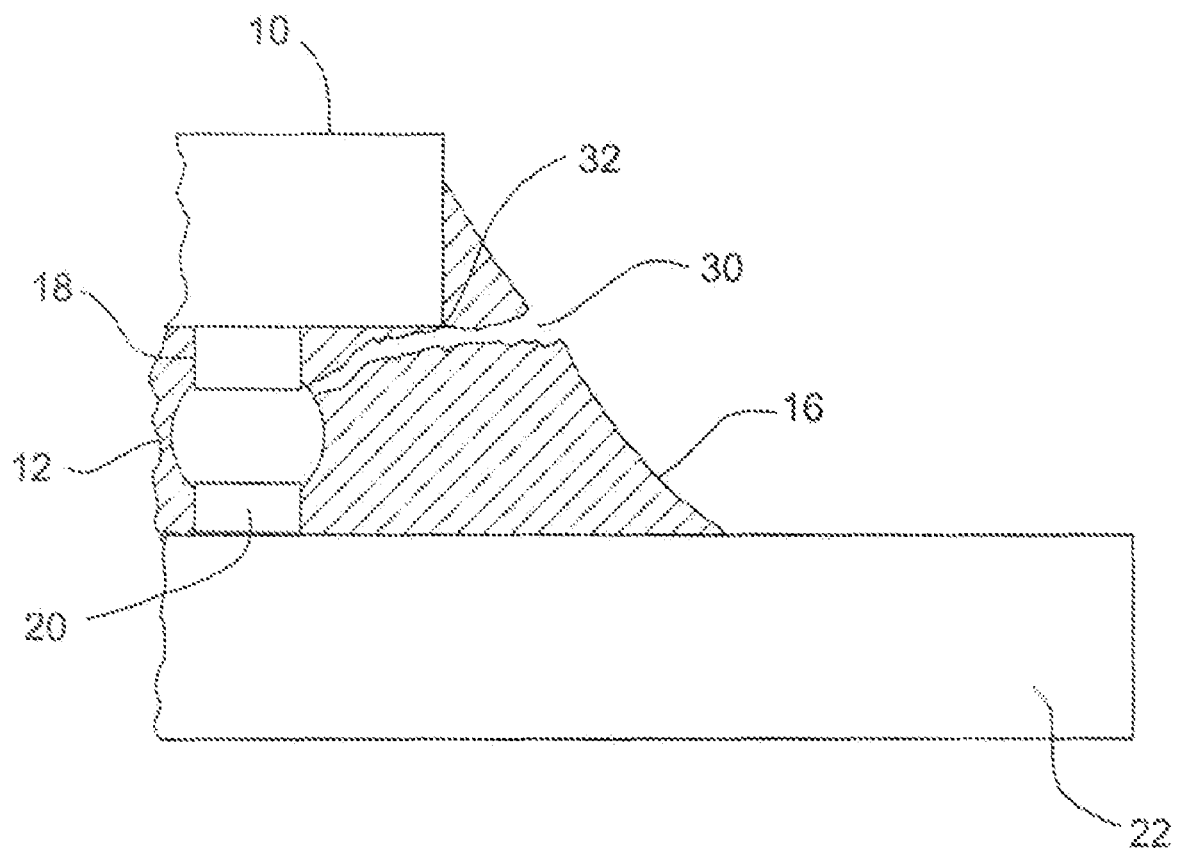
FIG. 2 illustrates an example of a corner cracking in the underfill of a prior art microelectronic assembly.
Figure 3:
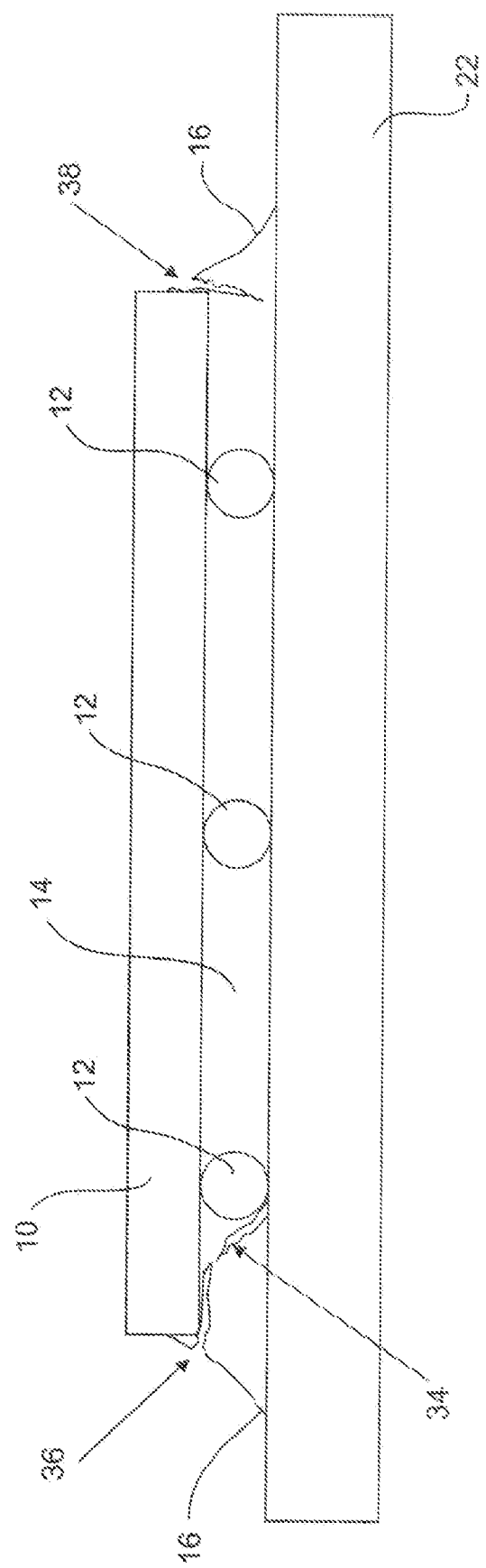
FIG. 3 illustrates examples of three common crack locations in the underfill of a prior art microelectronic assembly.

Referring again to the illustrative diagram of prior art FIG. 1, FIG. 1B shows an integrated circuit die, i.e., chip 10 mounted directly onto a supporting substrate 22 with solder bump interconnections 12. In this microelectronic assembly, the fillet 16 extends beyond the edge of the chip 10 and at least partially up the side of the chip. The concave shape of the fillet 16 from the corner of the chip 10 and out onto the supporting substrate 22 is effective to reduce the stress concentration on the microelectronic assembly. As mentioned above, however, the fillet position is not fully effective in preventing cracks in the underfill (UF) 14 due to the thermal stressing. In fact, most cracks initiate outside the chip shadow, i.e., beyond the edge of the chip 10 in the fillet 16. Prior art FIG. 3 further illustrates common crack locations that can occur in such traditional chip back end structures. The crack 34 is an example of a cohesive bond crack, which can occur anywhere in UF 14, and can further extend into the back end of the line (BEOL) structures of the supporting substrate 22. The crack 36 is an example of a surface crack (typically adhesive or a mixed cohesive-adhesive crack), which can form at the edge of the chip 10, or begin in the UF 14 as a cohesive crack. The crack 38 is an example of an adhesive or mixed adhesive-cohesive crack along the vertical sidewall of the chip 10, which also may have its roots in an UF cohesive fracture.

Figure 4B:
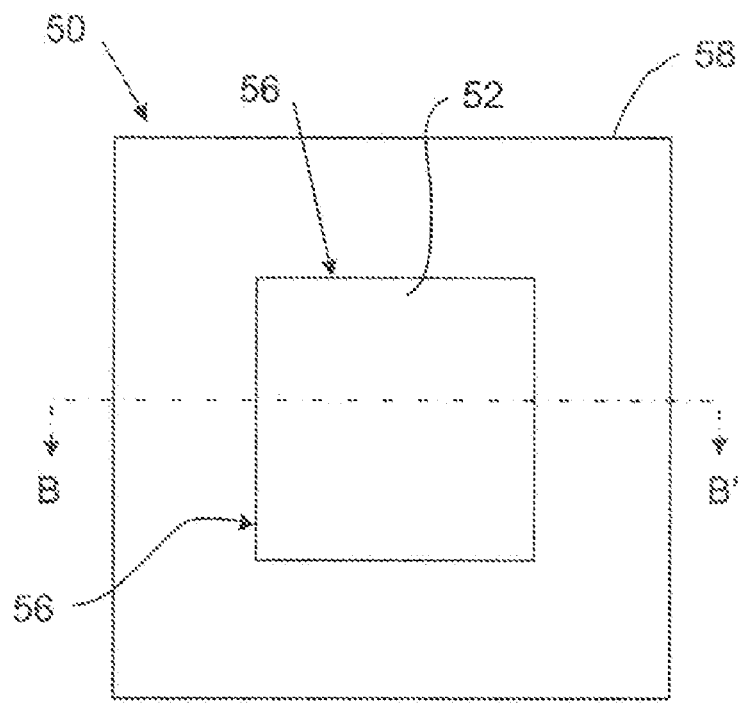
FIG. 4 illustrates an exemplary embodiment of a microelectronic assembly from (A) a cross-sectional perspective view, and (B) a top-down perspective view.
Figure 4A:
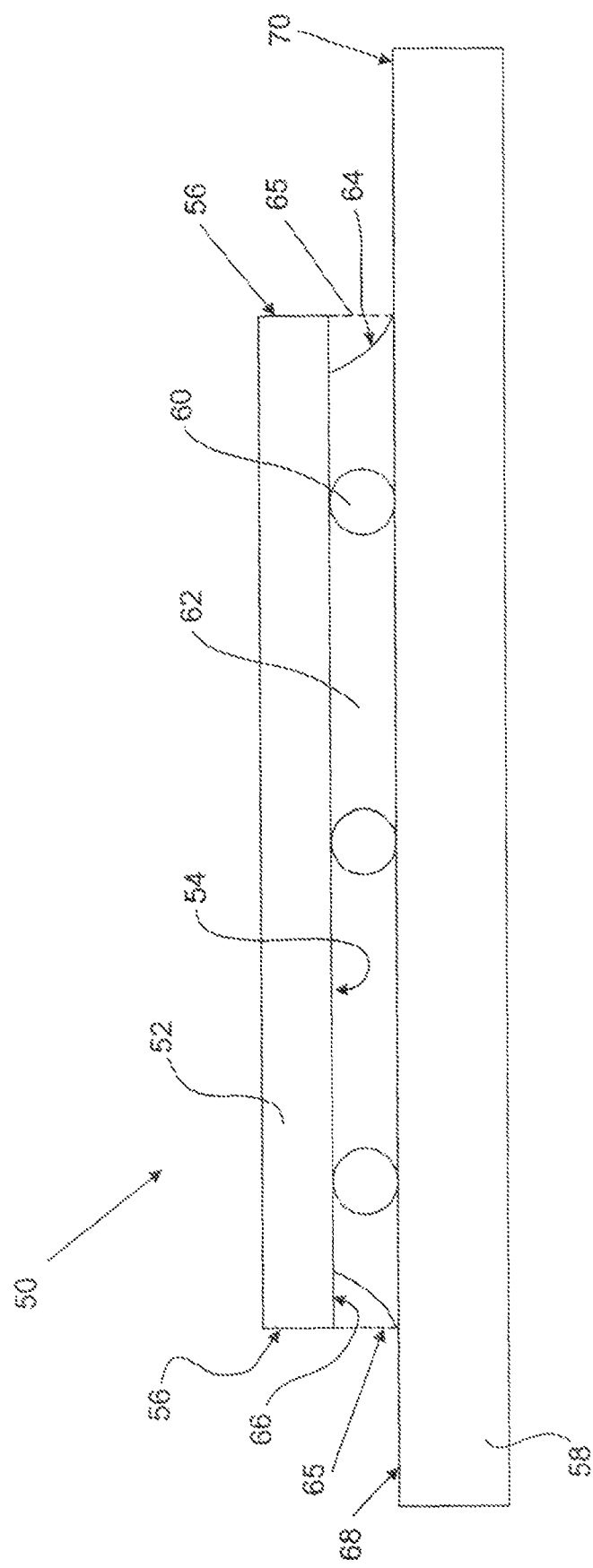

The present inventive structure, shown in FIGS. 4A and B, on the other hand, comprises a fillet, which does not extend beyond the chip shadow, to form a more resilient microelectronic assembly 50. The chip 52, having a bottom surface 54 and sidewalls 56, is mounted directly onto a supporting substrate 58 with solder bump interconnections 60. UF 62 seals the gap between the chip 52 and the supporting substrate 58, and an additional amount of the UF 62 is applied to create a uniform fillet 64 on the outer edges of the UF 62. Unlike the traditional fillet, such as that shown in FIG. 1, the fillet 64 does not extend beyond the vertical boundaries created by the chip sidewalls 56. In other words, the fillet does not cross the chip shadow line 65, which is formed by the defined length dimensions of the chip 52 over the supporting substrate 58. As can be seen in the top-down view provided by FIG. 4B, the fillet 64 does not extend out from underneath the chip—beyond the chip's shadow.

By removing the UF fillets that extend beyond the chip shadow, particularly the UF corner fillets, the most common crack initiation points are eliminated from the microelectronic assembly. Moreover, any crack that does start in the UF area, whether it is adhesive, cohesive, or mixed, has a shorter run path before the crack meets the crackstops, i.e., solder bump interconnections, and/or the moisture oxidation barrier (MOB) of the substrate. The reduction of the UF area, by keeping the fillets within the chip shadow, reduces the "G" factor, i.e., the energy release rate of the chip structure. This leads to a lower potential for crack propagation and subsequent assembly damage.

In an exemplary embodiment, the chip 52 is a silicon chip joined using a controlled collapse chip connection (C4) to a packaging substrate. The C4 connections, e.g., the solder bump interconnections 60, are encapsulated in the UF material 62 such that there is no UF present on the chip periphery. In other words, the fillet 64 is not present along the sidewalls 56 of the chip itself. In another embodiment, the fillet 64 does not extend on the laminate of the substrate beyond the chip shadow line 65 (as shown in FIG. 4A). The concave fillet shape, therefore, begins on a bottom surface 54 of the chip 52 and extends outward toward the vertical boundary created by the chip shadow line 65, but without extending beyond the line, such that the entire fillet 64 is beneath the chip itself.

One way to keep the fillet 64 within the shadow line 65 created by the chip sidewalls 56 is to create non-wettable zones on the chip 52 and the supporting substrate 58. The non-wettable zones can be formed of a material or a coating that prevents the UF 62 from adhering or cohering to the surface of the non-wettable zones. Suitable non-wettable coatings will depend on the properties of the underfill chosen for a particular flip-chip arrangement and will be known to those skilled in the art. A first non-wettable zone 66 is disposed on the outer perimeter of the bottom surface 54 of the chip 52. A second non-wettable zone 68 is disposed on the top surface 70 of the supporting substrate 58. As shown in FIG. 4A, the fillet 64 begins at the inner edge of the first non-wettable zone 66 and extends in it's concave fashion down to the inner edge of the second non-wettable zone 68 on the top surface of the supporting substrate 58.

A method of assembling the inventive flip chip arrangement includes attaching an semiconductor chip to a substrate, creating a first non-wettable zone on a bottom surface of the semiconductor chip and a second non-wettable zone on a top surface of the supporting substrate, underfilling the semiconductor chip, wherein a fillet is created at the inner perimeter of the first and the second non-wettable zones, and hardening the underfill including the fillet.

Attaching the semiconductor chip to the substrate includes bumping the semiconductor chip with solder bump interconnections, also known as crackstops. To bump the chip, the bottom surface of the chip can be coated with underbump metal (UBM) to make a better connection, protect the semiconductor from the bump materials, and define the bump size and location. The solder bump interconnections provide electrically conductive paths for power and signals and thermally conductive paths to carry away heat. The solder bump interconnections also mechanically attach the chip to the substrate and act as short leads to relieve mechanical strain. The solder bump interconnections can be added to the chips by several methods such as, without limitation, physical vapor deposition, electroplating, printing, bump transfer (solder sphere transfer or injection-molded solder transfer), solder jetting, and the like.

The bumped semiconductor chip is then placed on the supporting substrate along with a tacky solder flux. The flux holds the chip in position until reflow. Heating the chip-substrate assembly in an oven melts the solder, connecting the chip and the substrate. In the alternative, assemblies utilizing non-solder bumps can be assembled by thermocompression, thermosonic bonding, or with adhesives.

Non-wettable zones are created on the assembled chip-substrate structure. Alternatively, the non-wettable zones can be created on the chip and the supporting substrate individually prior to the attachment of the assembly with the solder bump interconnections. A first non-wettable zone is created on the outer perimeter of the bottom surface of the chip. Therefore, the outer portion of the chip's bottom surface is advantageously treated to form a non-wettable zone, so that none of the underfill adheres to the outer perimeter of the chip and therefore the fillet begins inside the outer portion of the chip's bottom surface. A second non-wetting zone is also created on the top surface of the supporting substrate. The non-wetting zone on the supporting substrate creates a perimeter around the chip shadow line created by the chip sidewalls, or in other words, the second non-wettable zone is immediately outside the chip shadow line. Like the semiconductor chip, the second region as described on the top surface of the substrate is coated with a non-wettable material so that none of the underfill adheres to the substrate laminate outside the chip shadow line. The fillet, therefore, advantageously cannot extend beyond the line.

The space created by the solder bumps between the chip and the substrate is then underfilled in order to strengthen the solder bump interconnections. A curable non-conductive polymeric underfill material is dispensed onto the substrate adjacent to the chip and is drawn into the gap by capillary action. The underfill material provides environmental protection, and mechanically locks together the chip and the substrate so that differences in thermal expansion of the two materials do not break the solder bump interconnections. The underfill material may comprise one or more polymerizable monomers, polyurethane prepolymers, constituents of block copolymers, constituents of radial copolymers, initiators, catalysts, cross-linking agents, stabilizers, and the like. Such materials polymeric materials contain molecules that are chained or cross-linked to form a strong bonding material as they are cured and hardened. In an exemplary embodiment, the underfill material is a cyanate ester epoxy resin, such as those manufactured by the Sumitomo Chemical Company or the Hitachi Chemical Company.

The underfill area is geographically bound by the non-wettable zones of both the chip and substrate, and therefore, does not extend beyond the chip shadow. The underfill, including the fillet, is then cured and hardened in this position to form the inventive flip chip microelectronic assembly.

In an alternative method, the chip can be underfilled without the creation of the non-wetting zones. In other words, a traditional flip chip microelectronic assembly can be produced, wherein the UF extends beyond the chip shadow and along the periphery of the chip itself, forming the conventional fillet beginning from the chip sidewall and extending beyond the chip shadow on the supporting substrate laminate. After the UF is dispensed beneath the chip, or even after the UF has cured, the UF material extending beyond the chip shadow on the supporting substrate, and the UF material on the periphery of the chip can be removed. Removal of the outer boundary of the dispensed and/or cured UF material can be done by several methods, such as, without limitation, laser removal, mechanical removal such as scraping, chipping, and the like, chemical removal such as breaking the fillet cross-links with a solvent solution, and other similar removal methods. In this method, the same exemplary structure, wherein the entire fillet remains beneath the chip shadow, is achieved without the need for non-wettable zones on the chip and the supporting substrate surfaces.

Although the above described inventive structures and methods provide specific details, these are meant to be illustrative and not limiting in their scope. For example, the substrate described in the various structures can be selected from a variety of microelectronic substrates such as organic laminates, silicon or gallium arsenide with embedded device regions and interconnect wiring, multilayer ceramic substrates, printed wiring board substrates, insulated metal substrates, packaging substrates, and the like. The integrated circuit die as described in the inventive structures can be a silicon chip or other suitable microelectronic components for back end of the line interconnections, as is known in the art.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of assembling a microelectronic flip-chip arrangement, comprising:
    attaching a chip having a defined length to a supporting substrate, wherein the chip forms a chip shadow line of the defined length on the supporting substrate;
    creating a first non-wettable zone on an outer portion of the bottom surface of the chip;
    creating a second non-wettable zone on a portion of the supporting substrate outside the chip shadow line;
    underfilling the chip with an underfill material and forming a fillet, wherein the fillet does not extend beyond the chip shadow line; and
    hardening the underfill including the fillet.

2. The method of claim 1, wherein attaching the chip further comprises
bumping the chip with solder bump interconnections and simultaneously heating the chip, solder bump interconnections, and supporting substrate.

3. The method of claim 1, wherein creating the first and second non-wettable zones comprises treating the chip and the supporting substrate to form a surface to which the underfill material cannot adhere.

4. The method of claim 1, wherein the underfill material is a polymeric material.

5. The method of claim 4, wherein hardening the underfill material comprises curing the polymeric material to form cross-links.

6. The method of claim 1, wherein the underfill material is a cyanate ester epoxy resin.

7. The method of claim 1, wherein the chip is a silicon chip.

8. The method of claim 1, wherein attaching the chip comprises a controlled collapse chip connection.

9. A method of assembling a microelectronic flip-chip arrangement, compromising:

attaching a chip having a defined length to a supporting substrate, wherein the chips forms a chip shadow line of the defined length on the supporting substrate;

underfilling the chip with an underfill material and forming a fillet on the periphery of the chip extending down to the supporting substrate beyond the chip shadow line;

hardening the underfill material including the fillet; and removing at least a portion of the fillet such that the fillet begins at the bottom surface of the chip extends down to the supporting substrate without extending beyond the chip shadow line.

10. The method of claim 9, wherein attaching the chip further comprises bumping the chip with solder bump interconnections and simultaneously heating the chip, solder bump interconnections, and supporting substrate.

11. The method of claim 9, wherein the underfill material is a polymeric material.

12. The method of claim 11, wherein hardening the underfill material comprises curing the polymeric material to form cross-links.

* * * * *